United States Patent
Shiomi et al.

(10) Patent No.: US 7,998,836 B1
(45) Date of Patent: Aug. 16, 2011

(54) METHOD FOR FABRICATING GALLIUM NITRIDE BASED SEMICONDUCTOR ELECTRONIC DEVICE

(75) Inventors: Hiromu Shiomi, Itami (JP); Shinsuke Fujiwara, Itami (JP); Yu Saitoh, Itami (JP); Makoto Kiyama, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 12/912,932

(22) Filed: Oct. 27, 2010

(51) Int. Cl.
*H01L 21/30* (2006.01)

(52) U.S. Cl. ............... 438/458; 257/E33.025

(58) Field of Classification Search .......... 438/458, 438/570; 257/E33.028, E33.033
See application file for complete search history.

(56) References Cited

U.S. PATENT DOCUMENTS

| | | | | |
|---|---|---|---|---|
| 2005/0247950 A1* | 11/2005 | Nakamura et al. | ............ | 257/98 |
| 2006/0189095 A1* | 8/2006 | Ghyselen et al. | ............ | 438/458 |
| 2007/0093037 A1* | 4/2007 | Zhu et al. | ............ | 438/458 |
| 2008/0293217 A1* | 11/2008 | Ghyselen et al. | ............ | 438/458 |

FOREIGN PATENT DOCUMENTS

| | | |
|---|---|---|
| JP | 2006-100801 | 4/2006 |
| JP | 2007-158133 | 6/2007 |

OTHER PUBLICATIONS

R. Kawai et al., "Investigation of APC alloy for high-reflectivity contact of blue LED", The 69th Meeting of the Japanese Society of Applied Physics, Preliminary Draft, Autumn 2008, Chuba University 5a-CA-9.

* cited by examiner

*Primary Examiner* — Thao P. Le
(74) *Attorney, Agent, or Firm* — Drinker Biddle & Reath LLP

(57) ABSTRACT

A method of fabricating a gallium nitride-based semiconductor electronic device is provided, the method preventing a reduction in adhesiveness between a gallium nitride-based semiconductor layer and a conductive substrate. A substrate 11 is prepared. The substrate 11 has a first surface 11a and a second surface 11b, the first surface 11a allowing a gallium nitride-based semiconductor to be deposited thereon. The substrate 11 includes a support 13 of a material different from the gallium nitride-based semiconductor. The support is exposed on the second surface 11b of the substrate 11. An array of grooves 15 is provided in the second surface 11b. A semiconductor region including at least one gallium nitride-based semiconductor layer is deposited on the first surface 11a of the substrate 11, and thereby an epitaxial substrate E is fabricated. A conductive substrate 33 is bonded to the epitaxial substrate E such that the semiconductor region 17 is provided between the first surface 11a of the substrate 11 and the conductive substrate E. Subsequently, the second surface 11b is irradiated with laser light for laser lift-off.

20 Claims, 6 Drawing Sheets

(a)

(b)

(a)

(b)

(a)

(b)

(a)

(b)

METHOD FOR FABRICATING GALLIUM NITRIDE BASED SEMICONDUCTOR ELECTRONIC DEVICE

BACKGROUND OF THE INVENTION

1. Field of the Invention

The present invention relates to a method for fabricating a gallium nitride-based semiconductor electronic device.

2. Related Background Art

Patent Literature 1 (Japanese Unexamined Patent Application Publication No. 2007-158133) discloses a laser lift-off process. A light-emitting region, an n-type layer, and a p-type layer are formed on a sapphire substrate. An n-type silicon substrate is then prepared, and conductive multilayer films are vapor-deposited on two surfaces of the substrate. Subsequently, an electrode on the p-type layer and the conductive multilayer film on the n-type silicon substrate are hot-pressed at a temperature of 300° C. to coalesce the two substrates. The back surface of the sapphire substrate is then irradiated with laser light so that GaN on the surface of the n-type layer is decomposed. The sapphire substrate is then removed by a lift-off process.

Patent Literature 2 (Japanese Unexamined Patent Application Publication No. 2006-100801) discloses a group-III nitride semiconductor element having a structure exhibiting improved reverse-voltage resistance. The group-III nitride semiconductor element is provided on a GaN substrate.

Non-Patent Literature 1 (The 69th Academic Meeting of The Japan Society of Applied Physics, Preliminary Draft, Autumn 2008, Chubu University, 5a-CA-9) discloses re-lamination of a homoepitaxial GaN layer on a GaN substrate to a Si substrate.

SUMMARY OF THE INVENTION

It is preferred in view of crystal growth that a GaN substrate be used to fabricate a gallium nitride-based semiconductor electronic device. Since the GaN substrate is expensive, it is desired to use a support comprising a material different from the GaN substrate. During deposition of a gallium nitride-based semiconductor layer on the support comprising a different material, however, the support and the gallium nitride-based semiconductor layer warp due to stress, unlike deposition on the GaN substrate. The inventors found that the warpage adversely affects the adhesiveness between the gallium nitride-based semiconductor layer and a conductive substrate in a process of bonding the conductive substrate to the gallium nitride-based semiconductor layer on the support comprising the different material.

In view of the circumstances above, an object of the present invention is to provide a method of fabricating a gallium nitride-based semiconductor electronic device, the method preventing a reduction in adhesiveness between a gallium nitride-based semiconductor layer and a conductive substrate.

An aspect of the present invention provides a method of fabricating a gallium nitride-based semiconductor electronic device. The method comprises the steps of (a) preparing a substrate having a first surface and a second surface, the first surface being configured to deposit a gallium nitride-based semiconductor, the second surface being provided on the side opposite to the first surface; (b) depositing a semiconductor region on the first surface of the substrate into an epitaxial substrate, the semiconductor region comprising at least one gallium nitride-based semiconductor layer; (c) preparing a conductive substrate; (d) bonding the conductive substrate to the epitaxial substrate into a first substrate product such that the semiconductor region is provided between the first surface of the substrate and the conductive substrate; and (e) separating the semiconductor region and the substrate from each other by laser lift-off involving irradiation of the second surface of the substrate with laser light, subsequent to the bonding of the conductive substrate to the epitaxial substrate, to fabricate a second substrate product comprising the conductive substrate and the semiconductor region. The semiconductor region of the second substrate product has an exposed surface. The substrate comprises a support comprising a material different from the gallium nitride-based semiconductor. The support is exposed on the second surface of the substrate. At least one of a plurality of grooves and a plurality of ridges is arrayed on the second surface of the substrate.

In the method, at least one of a plurality of grooves and a plurality of ridges is arrayed on a second surface of a substrate, thus reducing internal stress of an epitaxial substrate. Accordingly, the warpage of the epitaxial substrate is small. Good adhesiveness can be obtained between the epitaxial substrate and a conductive substrate in bonding thereof. Adhesiveness of a second substrate product is thus retained in a junction of the conductive substrate and a semiconductor region in a state in which the internal stress remains low.

The method further includes separating the semiconductor region and the substrate from each other, and then forming a first electrode on the exposed surface of the second substrate product. The semiconductor region includes a contact layer of gallium nitride-based semiconductor doped with an n-type dopant. The contact layer is exposed on the exposed surface of the semiconductor region. Since the contact layer appears in the exposed surface of the semiconductor region in the method, the contact layer and the first electrode can form an excellent junction.

The semiconductor region includes a drift layer of gallium nitride-based semiconductor in the method. The contact layer is provided between the drift layer and the support. The contact layer has a higher carrier concentration than the drift layer. The drift layer may have a carrier concentration of not more than $2 \times 10^{16}$ cm$^{-3}$. A carrier concentration of the drift layer of not more than $2 \times 10^{16}$ cm$^{-3}$ in the method provides an appropriate carrier concentration to obtain a desired voltage resistance.

The drift layer may have a thickness of not less than 3 μm in the method. A thickness of the drift layer of not less than 3 μm in the method is suitable to obtain a desired voltage resistance.

In the method, the contact layer may include gallium nitride, and the drift layer may include gallium nitride. The contact layer and the drift layer which include gallium nitride in the method provide excellent crystallinity of the semiconductor region.

The exposed surface may be a polished surface in the method. In the method, a melted surface formed in separation by laser lift-off is polished, and thereby a polished surface is provided in the semiconductor region.

The grooves may have a depth of not less than 5 μm and not more than 300 μm in the method. A depth of the grooves of less than 5 μm impairs stress relaxation effect. A depth of the grooves of more than 300 μm causes a decrease in a yield of semiconductor chips for electronic devices. Furthermore, the grooves may have a depth that is not less than 1/10 of the thickness of the support and not more than 2/3 thereof in the method. A depth of the grooves of less than 1/10 of the thickness of the support substantially does not contribute to a reduction in warpage. A depth of the grooves of more than 2/3 of the thickness of the support causes a decrease in the yield of semiconductor chips for electronic devices.

The ridges may have a height of not less than 5 μm and not more than 300 μm in the method. A height of the ridges of less than 5 μm substantially does not contribute to a reduction in warpage. A height of the ridges of less than 5 μm substantially does not contribute to a reduction in warpage. Furthermore, a height of the ridges of less than 1/10 of the thickness of the support substantially does not contribute to a reduction in warpage. A height of the ridges of more than 2/3 of the thickness of the support causes a decrease in the yield of semiconductor chips for electronic devices.

The support may include one of sapphire, silicon carbide, and aluminum nitride in the method. The support of one of such materials facilitates favorable crystal growth and excellent warpage reduction.

Prior to fabrication of the first substrate product, an insulating film may be formed on a principal surface of the semiconductor region of the epitaxial substrate, and then an electrode structure may be formed. The electrode structure includes a field plate electrode and a second electrode, the field plate electrode being provided on the insulating film, the second electrode being in contact with the principal surface of the semiconductor region through an opening of the insulating film. The second electrode and the field plate electrode may be electrically connected to the conductive substrate. The method provides an electrode structure applicable to a high-voltage electronic device.

The second electrode may include a Schottky electrode in the method, thus providing an electronic device including a Schottky junction. For example, the gallium nitride-based semiconductor electronic device may include a Schottky barrier diode in the method.

In the method, the second electrode may include an ohmic electrode; the semiconductor region may include a p-type gallium nitride-based semiconductor layer and an n-type gallium nitride-based semiconductor layer; the p-type gallium nitride-based semiconductor layer and the n-type gallium nitride-based semiconductor layer form a p-n junction; and the second electrode forms a junction with the p-type gallium nitride-based semiconductor layer. The method thus provides an electronic device including a p-n junction. For example, the gallium nitride-based semiconductor electronic device may include a p-n junction diode in the method.

The semiconductor region may be provided with a sacrificed layer including a semiconductor layer having a smaller band gap than that of the support in the method. The band gap of the sacrificed layer is smaller than energy corresponding to a wavelength of the laser light. Thus, the sacrificed layer can be melted by irradiation with the laser light.

The sacrificed layer provided most proximate to the substrate has the smallest band gap in the semiconductor region in the method. Thus, the laser light does not deeply intrude into the semiconductor region during the laser lift-off process.

The epitaxial substrate may be bonded to the conductive substrate using a conductive adhesive agent in the method. The conductive adhesive agent in the method ensures an electric connection.

The bonding of the epitaxial substrate to the conductive substrate may be performed by pressure-bonding in the method. The pressure-bonding in the method secures an electric connection. Furthermore, the conductive substrate may include molybdenum, tungsten, or an alloy thereof in the method.

The object described above and other objects, advantages, benefits of the present invention will be more easily demonstrated from detailed explanations of the embodiments of the present invention with reference to the attached drawings.

DESCRIPTION OF THE PREFERRED EMBODIMENTS

Figure 1:
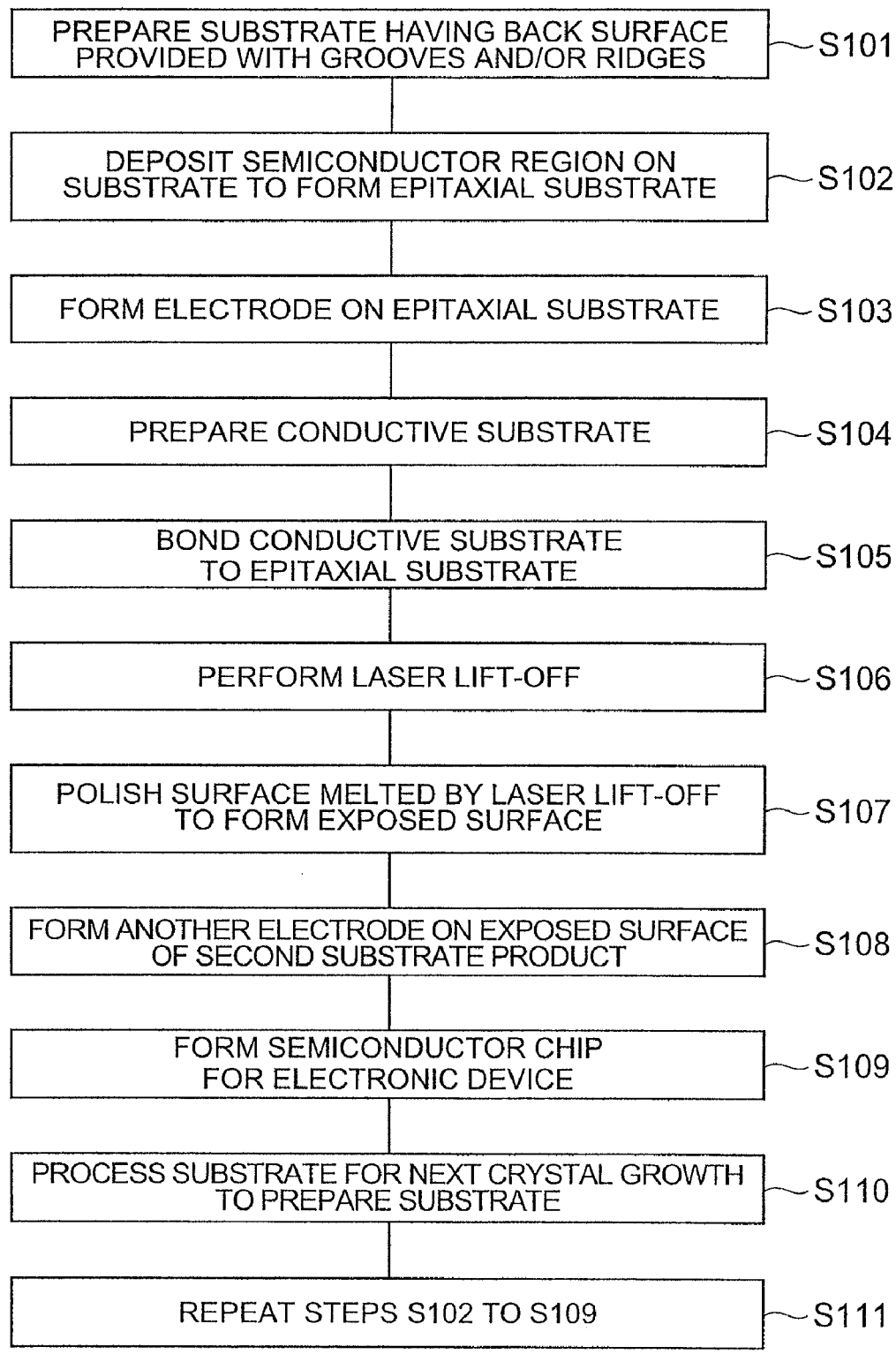
FIG. 1 is a drawing showing a main process in a method of fabricating a gallium nitride-based semiconductor electronic device, a method of fabricating an epitaxial substrate for a gallium nitride-based semiconductor electronic device, and a method of fabricating a gallium nitride-based semiconductor electronic device by bonding, according to an embodiment of the present invention.

Findings of the present invention can easily be understood from detailed explanations below with reference to the attached drawings presented as examples.

Embodiments are explained below with reference to the attached drawings, with respect to a method of fabricating a gallium nitride-based semiconductor electronic device, a method of fabricating an epitaxial substrate for a gallium nitride-based semiconductor electronic device, and a method of fabricating a gallium nitride-based semiconductor electronic device by bonding, according to the present invention. The same reference numerals are assigned to the same components wherever possible.

FIG. 1 is a drawing showing a main process in a method of fabricating a gallium nitride-based semiconductor electronic device, a method of fabricating an epitaxial substrate for a gallium nitride-based semiconductor electronic device, a laser lift-off method, and a method of fabricating a gallium nitride-based semiconductor electronic device by bonding, according to an embodiment of the present invention. FIG. 2, FIG. 3, FIG. 4 and FIG. 5 are drawings schematically showing main steps in the process.

Figure 2:
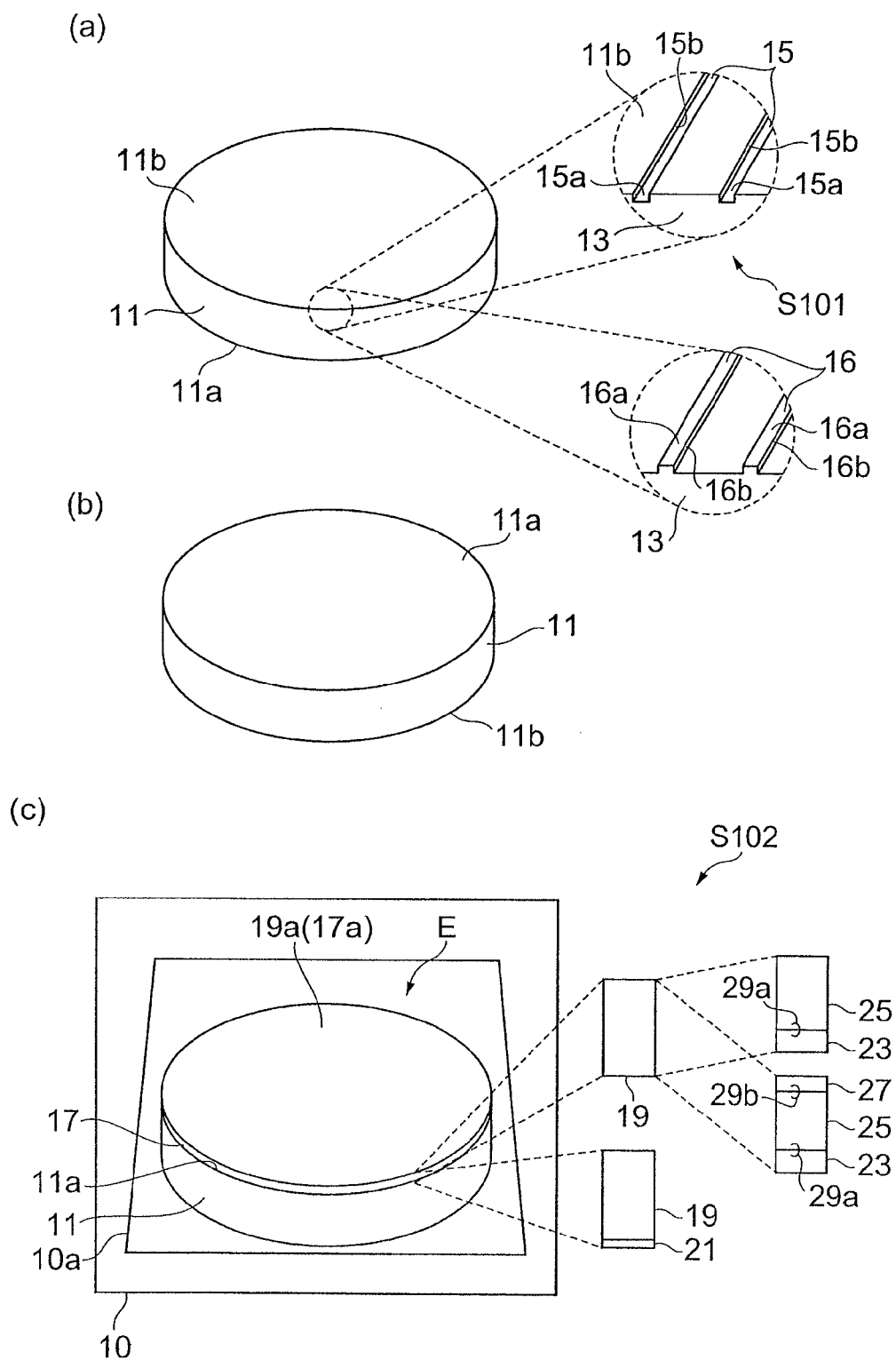
FIG. 2 is a drawing schematically showing main steps in the process according to an embodiment of the present invention.

In Step S101 shown in FIG. 1, a substrate 11 is prepared, as shown in Parts (a) and (b) of FIG. 2. The substrate 11 has a first surface 11a and a second surface 11b. The second surface 11b resides on a reverse side of the first surface 11a. A gallium nitride-based semiconductor can be deposited on the first surface 11a. The substrate 11 includes a support 13 of a material different from the gallium nitride-based semiconductor. The support 13 may include, for example, sapphire, aluminum nitride, silicon carbide, gallium oxide, and spinel. The supports of such materials facilitate favorable crystal growth. The support 13 is exposed on the second surface 11b. The minimum value of the band gap of the material included in the support 13 is greater than the band gap of gallium nitride.

In the embodiment shown in Part (a) of FIG. 2, a plurality of grooves 15 is arrayed in the second surface 11b. Each of the grooves 15 has a bottom surface 15a and a side surface 15b. In lieu of the array of grooves 15, an array of ridges 16 may be provided on the second surface 11b. Each of the ridges 16 has an upper surface 16a and a side surface 16b. At least either of the grooves or the ridges may be arrayed.

In the explanation hereinafter, the second surface 11b of the substrate 11 is provided with the array of grooves 15. The support 13 is exposed on the first surface 11a. Alternatively, the first surface 11a may substantially be a flat surface. Instead, the first surface 11a may include a surface of the support 13 and a mask of a silicon-based inorganic compound provided on the surface, if necessary. The mask may have any pattern, for example, a stripe pattern or a lattice pattern. The silicon-based inorganic compound may be, for example, silicon oxide or silicon nitride. Alternatively, a GaN template may be formed on the support 13.

Subsequently, the substrate 11 is placed on a susceptor 12 in a growth furnace 10. In the growth furnace 10, crystal growth may be performed by organometallic vapor phase epitaxy, molecular beam epitaxy, hydride vapor phase epitaxy, fluxing, sublimation, or any other process.

In Step S102, a semiconductor region 17 is deposited on the first surface 11a of the substrate 11 into an epitaxial substrate E, as shown in Part (c) of FIG. 2. The semiconductor region 17 includes at least one gallium nitride-based semiconductor layer.

The semiconductor region 17 may include a semiconductor laminate 19 for an electronic device for example. The semiconductor region 17 includes a first conductive contact layer 23. The contact layer 23 includes a gallium nitride-based semiconductor doped with a first conductive dopant. Examples of the gallium nitride-based semiconductor may include n-type GaN, n-type AlGaN, or the like. The contact layer 23 may have a thickness of not less than 0.001 µm. This thickness may propagate information on crystal orientation required for epitaxial growth in a subsequent step, even at a single atomic layer. The thickness of the contact layer 23 may be not more than 50 µm. A thickness of more than 50 µm results in a great loss in series resistance in the contact layer. A surface 19a of the top layer of the semiconductor laminate 19 appears in a principal surface 17a of the semiconductor region 17. The semiconductor region 17 may include, for example, a sacrificed layer 21 for laser lift-off. The sacrificed layer 21 includes a semiconductor layer having a smaller band gap than the band gap of the support 13. The semiconductor layer has the smallest band gap than any semiconductor in the semiconductor laminate 19. The band gap of the sacrificed layer 21 is smaller than energy corresponding to a wavelength of laser light for laser lift-off. Thus, the sacrificed layer 21 is melted by radiation of the laser light. The sacrificed layer 21 may include, for example, InGaN, InAlGaN, or the like. Furthermore, the sacrificed layer 21 may have a quantum well structure.

The semiconductor laminate 19 includes a drift layer 25 of a gallium nitride-based semiconductor. Examples of the gallium nitride-based semiconductor may include GaN, AlGaN, or the like. The contact layer 23 is provided between the drift layer 25 and the sacrificed layer 21. A carrier concentration $N_{CON1}$ of the contact layer 23 is greater than the carrier concentration $N_{DRFT}$ of the drift layer 25. The carrier concentration $N_{CON1}$ of the contact layer 23 may be not less than $1\times10^{18}$ cm$^{-3}$. The carrier concentration $N_{DRFT}$ of the drift layer 25 may be not more than $2\times10^{16}$ cm$^{-3}$ and not less than $1\times10^{14}$ cm$^{-3}$. Thereby, an appropriate carrier concentration is provided to obtain a desired voltage resistance. The thickness of the drift layer 25 may be not less than 3 µm. An appropriate film thickness is thus provided to obtain a desired voltage resistance. The thickness of the drift layer 25 may be not more than 1,000 µm. An exemplary epitaxial substrate E includes the contact layer 23 and the drift layer 25, which are deposited in sequence on the first surface 11a of the substrate 11. The contact layer 23 and the drift layer 25 form a junction 29a. In a practical embodiment, the contact layer 23 includes gallium nitride, and the drift layer 25 includes gallium nitride. In the embodiment, the contact layer 23 and the drift layer 25 include gallium nitride, thus providing excellent crystallinity of the semiconductor laminate 19.

The semiconductor laminate 19 includes a second conductive semiconductor layer 27. The semiconductor layer 27 includes a gallium nitride-based semiconductor doped with a first conductive dopant. Examples of the gallium nitride-based semiconductor may include GaN, AlGaN, or the like. An alternative exemplary epitaxial substrate E includes a first conductive contact layer 23, a drift layer 25, and a second conductive semiconductor layer 27 deposited in sequence on a first surface 11a of a substrate 11. The contact layer 23 and the drift layer 25 form a junction 29a. The semiconductor layer 27 and the drift layer 25 form a junction 29b, which is a p-n junction. The carrier concentration $N_{CON2}$ of a semiconductor layer 31 is greater than the carrier concentration $N_{DRFT}$ of the drift layer 25. Thus, a depletion layer in the p-n junction is formed in the drift layer 25, not in the semiconductor layer 27. In a practical embodiment, the contact layer 23 includes gallium nitride; the drift layer 25 includes gallium nitride; and the semiconductor layer 27 includes gallium nitride. In the embodiment, the contact layer 23, the drift layer 25, and the semiconductor layer 27 include gallium nitride, thus providing excellent crystallinity of the semiconductor laminate 19. Furthermore, it is preferred that the junctions 29a and 29b be homo junctions. The semiconductor laminate 19 is by no means limited to the specific structure described above. Since the array of grooves 15 is provided on the second surface 11b of the substrate 11, warpage of the epitaxial substrate E including the semiconductor laminate 19 is limited.

In Step S103, an array of first electrodes is formed on the surface 19a of the semiconductor laminate 19 (principal surface 17a of the semiconductor region 17). Each of the first electrodes is provided for an electronic device. In the case where the electronic device is a Schottky barrier diode, the first electrode is a Schottky electrode, which forms a Schottky junction with the drift layer 25. In the case where the electronic device is a p-n junction diode, the first electrode forms an ohmic junction with the second conductive semiconductor layer 27. Thus, the first electrode is an ohmic electrode.

Figure 3:
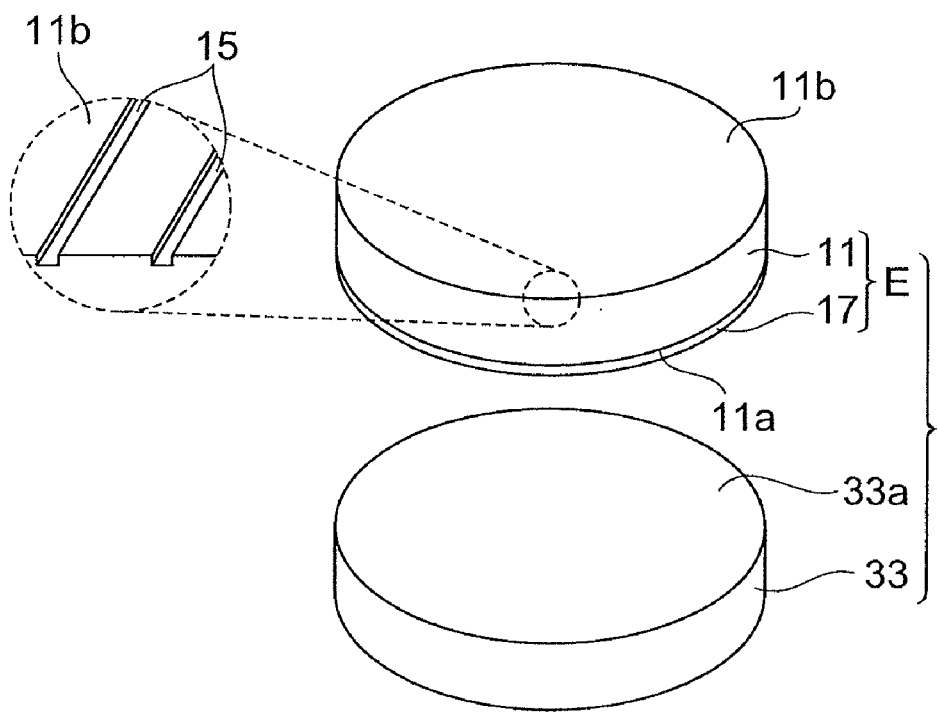
FIG. 3 is a drawing schematically showing main steps in the process according to the embodiment.
Figure 3:
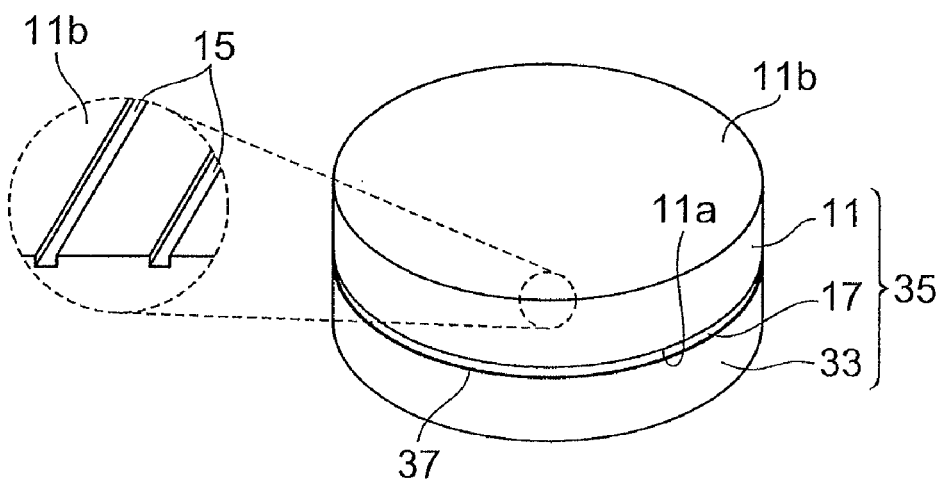

In Step S104, a conductive substrate 33 is prepared, as shown in Part (a) of FIG. 3. The conductive substrate 33 may be a metal substrate of, for example, molybdenum, tungsten, or an alloy thereof. The size of a principal surface 33a of the conductive substrate 33 may be greater than the size of the first surface 11a of the substrate 11. Thus, the entire epitaxial substrate E is sufficiently used to fabricate the electronic device.

In Step S105, the conductive substrate 33 is bonded to the epitaxial substrate E into a first substrate product 35, as shown in Part (b) of FIG. 3. In the first substrate product 35, the semiconductor region 17 is positioned between the first surface 11a of the substrate 11 and the conductive substrate 33.

The epitaxial substrate E may be bonded to the conductive substrate 33 through a conductive adhesive layer 37, for instance. The conductive adhesive layer 37 may be formed by applying a conductive adhesive agent, for instance. The conductive adhesive layer 37 provides not only a physical connection between the ohmic electrode on the semiconductor region 17 and the conductive substrate 33, but also an electric connection therebetween. The conductive adhesive layer 37 ensures the electric connection. Examples of the conductive adhesive agent may include solder, such as AuSn, SnPb, or the like. The bonding may also be performed by pressure-bonding, which ensures an electric connection. For example, the respective bonded surfaces of the epitaxial substrate and the conductive substrate are preliminarily plasma-treated and activated, and then subsequently pressure-bonded. Chemical bonding is thereby formed at the interface.

Figure 4:
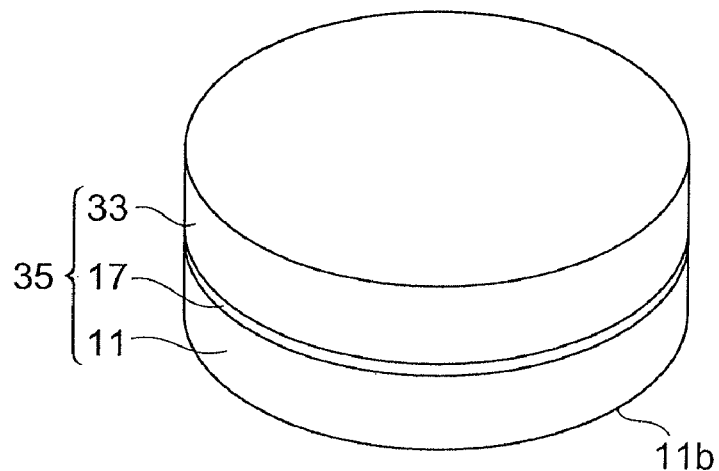
FIG. 4 is a drawing schematically showing main steps in the process according to the embodiment.
Figure 4:
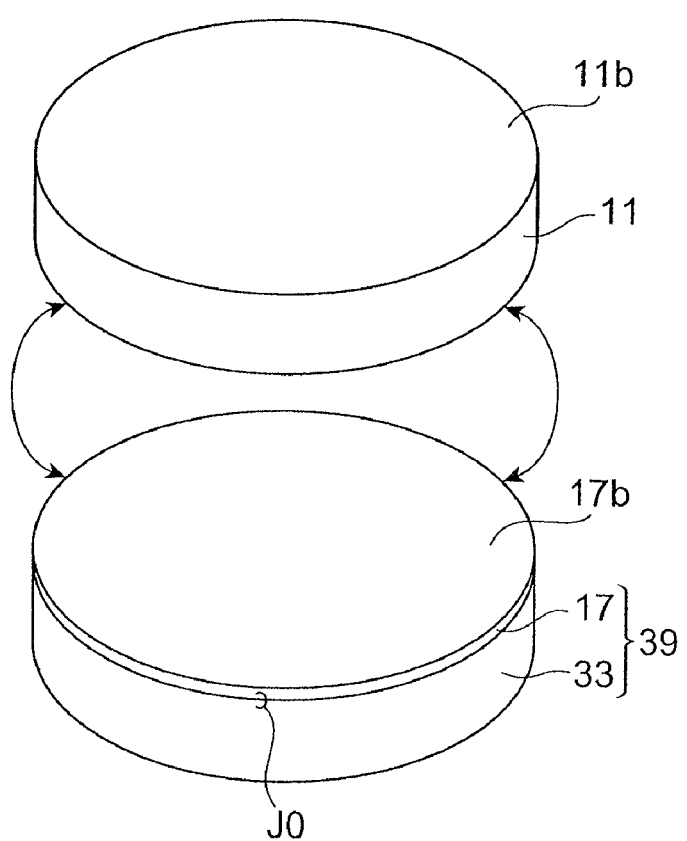

After the conductive substrate 33 is bonded to the epitaxial substrate E, the semiconductor region 17 is separated from the substrate 11 by laser lift-off in Step S106, as shown in Part (a) of FIG. 4. Thereby, a second substrate product 39 is fabricated. The second substrate product 39 includes the conductive substrate 33 and the semiconductor region 17, for example, as shown in Part (b) of FIG. 4. The second surface 11b of the substrate 11 is irradiated with laser light L for laser lift-off, as shown in Part (a) of FIG. 4. The wavelength of the laser light L is longer than the wavelength corresponding to the minimum band gap value of the material included in the substrate 11. Furthermore, the wavelength of the laser light L is shorter than the wavelength corresponding to the band gap of gallium nitride.

As explained above, in the case of a semiconductor region 17 including the sacrificed layer 21, the sacrificed layer 21 has the smallest band gap in the semiconductor region 17. Thereby, the laser light does not deeply intrude into the semiconductor region 17 during the laser lift-off process, and thus the semiconductor laminate 19 can be protected. The laser lift-off forms a melted surface 17b in the semiconductor region 17 of the second substrate product 39.

According to these steps, at least either of the array of grooves or the array of ridges is provided to the second surface 11b of the substrate 11, thus reducing stress of the epitaxial substrate E. An excellent adhesiveness between the epitaxial substrate E and the conductive substrate 33 is obtained in bonding of the epitaxial substrate E and the conductive substrate 33. Thus, adhesiveness is retained at a junction JO between the conductive substrate 33 and the semiconductor region 17 of the second substrate product 39.

Figure 5:
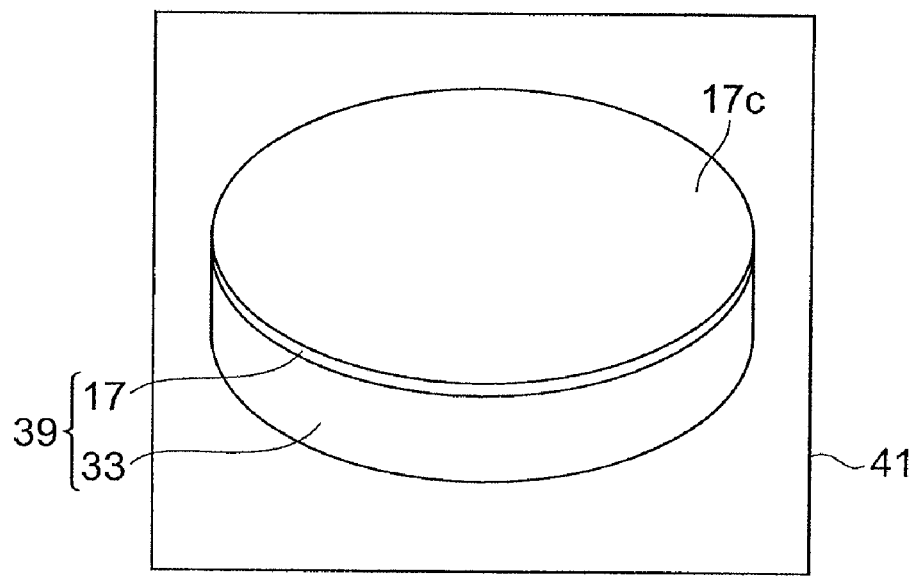
FIG. 5 is a drawing schematically showing main steps in the process according to the embodiment.
Figure 5:
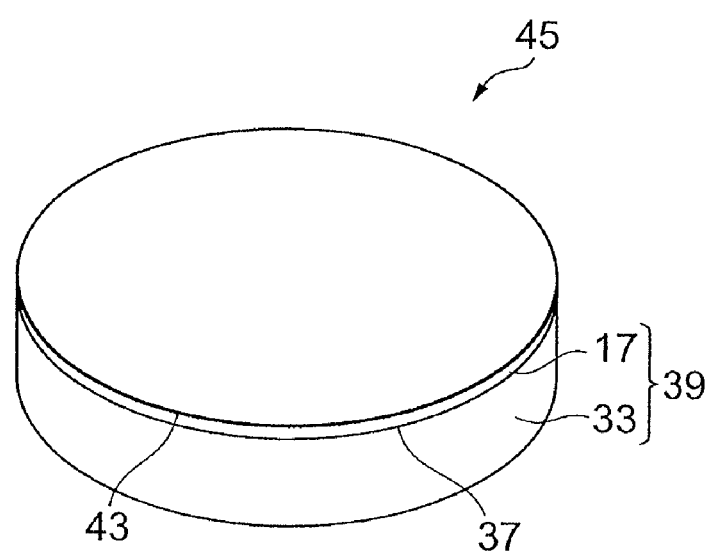

If necessary, a polishing apparatus 41 may be used to polish the melted surface 17b, and thereby an exposed surface 17c is provided to the second substrate product 39 in Step S107, as shown in Part (a) of FIG. 5. In the process, the melted surface 17b, which is formed in the separation by laser lift-off, is polished, and the flatly polished exposed surface 17c is provided in the semiconductor region 17. The contact layer 23 is exposed on the exposed surface 17c of the semiconductor region 17.

In Step S108, an electrode 43 is formed on the exposed surface 17c of the second substrate product 39. Since the contact layer 23 appears in the exposed surface 17c of the semiconductor region 17, an excellent junction of the contact layer 23 and the electrode 43 may be obtained. The junction may be an ohmic junction. The electrode 43 may be provided so as to cover the entire surface of the exposed surface 17c. Through the steps, a third substrate product 45 is provided. The third substrate product 45 includes the conductive substrate 33, the conductive adhesive layer 37, the semiconductor region 17, and the electrode 43. The treating temperature T2 to form the electrode 43 is lower than the treating temperature T1 to form the bonding. Satisfactory bonding can be ensured during the formation of the electrode 43. Thereby, excellent electric properties and high reliability can be achieved in the bonding.

After the electrode 43 is formed, the third substrate product 45 is separated into semiconductor chips for individual electronic devices in Step S109.

If necessary, the substrate 11 separated in Step S106 may be reclaimed in Step S110. In the reclamation, the first surface 11a of the substrate 11 is treated to a state in which crystal can be grown. The reclamation may include polishing, for instance. The first surface 11a is reproduced by the polishing. Furthermore, Steps S102 to S109 explained above are repeated in Step S111.

Figure 6:
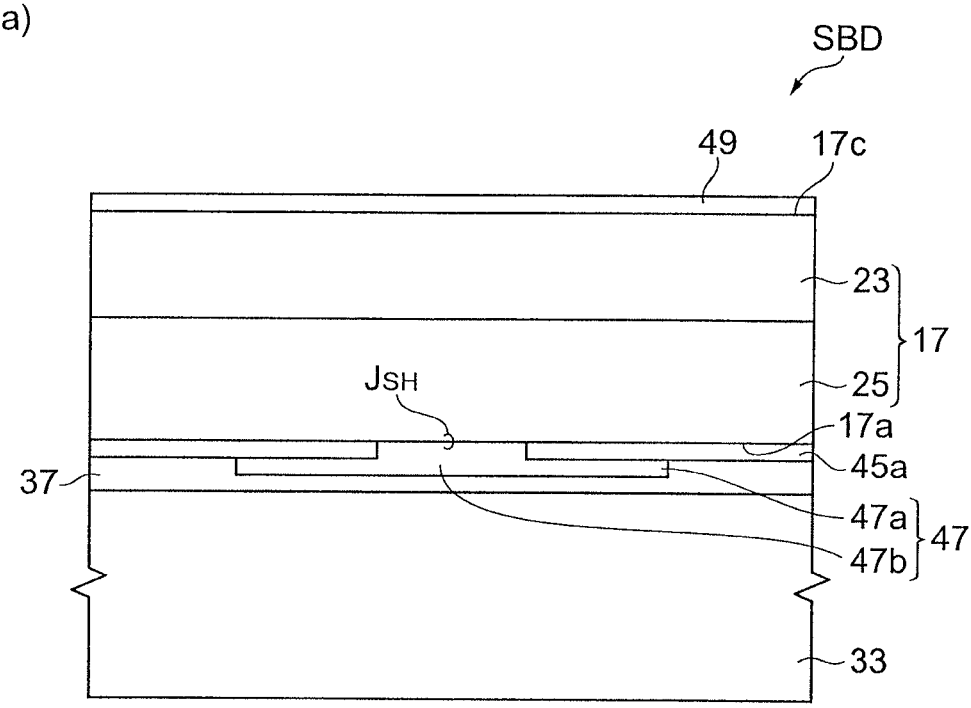
FIG. 6 is a drawing schematically showing structures of a separated semiconductor chip for an electronic device.
Figure 6:
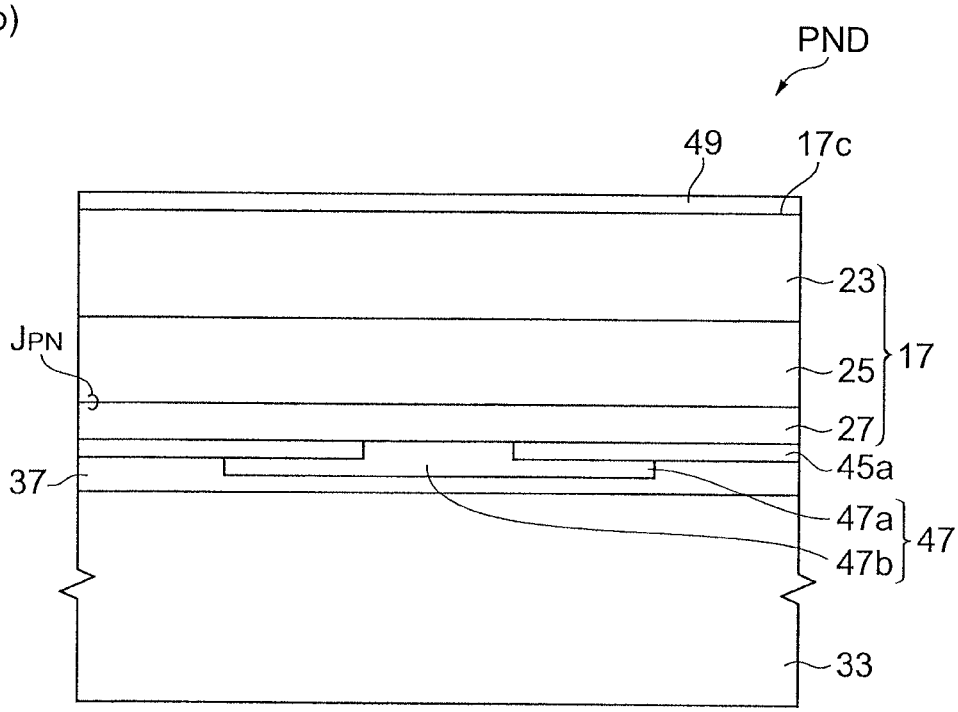

FIG. 6 is a drawing schematically showing structures of a separated semiconductor chip for an electronic device. Part (a) of FIG. 6 illustrates a Schottky barrier diode SBD as an embodiment of the semiconductor chip for the electronic device. Prior to the bonding, an insulating film 45a can be formed on the principal surface 17a of the semiconductor region 17 of the epitaxial substrate E, while an electrode structure 47 can also be formed. The electrode structure 47 includes a field plate electrode 47a and a second electrode 47b, the field plate electrode 47a being provided on the insulating film 45a, the second electrode 47b being in contact with the principal surface 17a of the semiconductor region 17 through an opening of the insulating film 45a. The second electrode 47b and the field plate electrode 47a may be electrically connected to the conductive substrate 33 through the conductive adhesive layer 37. The process provides the electrode structure 47 applicable to a high-voltage electronic device. The second electrode 47b may include a Schottky electrode. The structure provides an electronic device including a Schottky junction $J_{SH}$. Furthermore, the Schottky barrier diode SBD includes an electrode 49 on the exposed surface 17c of the semiconductor region 17. The electrode 49 forms an ohmic contact with the contact layer 23 of the semiconductor region 17.

Part (b) of FIG. 6 illustrates a p-n junction diode PND as an alternative embodiment of the semiconductor chip for the electronic device. The semiconductor region 17 includes a semiconductor layer 27 (referred to as "p-type gallium nitride-based semiconductor layer" in the embodiment) and a drift layer (referred to as "n-type gallium nitride-based semiconductor layer" in the embodiment). The p-type gallium nitride-based semiconductor layer 27 and the n-type gallium nitride-based semiconductor layer 25 define a p-n junction $J_{PN}$. A second electrode 47b and a field plate electrode 47a may be electrically connected to a conductive substrate 33 through a conductive adhesive layer 37. The second electrode 47b can define a junction with the p-type gallium nitride-based semiconductor layer 27 through an opening of an insulating film 45a. The process provides an electrode structure 47 applicable to a high-voltage electronic device.

With reference to Part (a) of FIG. 2 again, the array of grooves 15 is provided in the second surface 11b, which is the back surface of the substrate 11. The substrate 11 (or support 13) may have a thickness of, for example, not less than 50 μm and not more than 1,000 μm. The grooves 15 may have a depth of not less than 5 μm. A depth of the grooves 15 of less than 5 μm adversely affects a stress relaxation effect. The depth of the grooves 15 may be not more than 300 μm. A depth of the grooves 15 of more than 300 μm causes a decrease in the yield of semiconductor chips for electronic devices.

The grooves 15 may have a depth that is not less than 1/10 of the thickness of the support 13. A depth of the grooves 15 of less than 1/10 of the thickness of the support 13 substantially does not contribute to a reduction in warpage. The depth of the grooves 15 may be not more than 2/3 of the thickness of the support 13. A depth of the grooves 15 of more than 2/3 of the thickness of the support causes a decrease in the yield of semiconductor chips for electronic devices.

Alternatively, in lieu of the grooves 15, the array of ridges is provided on the second surface 11b of the substrate 11. The ridges may have a height of not less than 5 μm. A height of the ridges of less than 5 μm substantially does not contribute to a reduction in warpage. Furthermore, the height of the ridges may be not more than 300 μm. A height of the ridges of less than 5 μm substantially does not contribute to a reduction in warpage. A height of the ridges of less than 1/10 of the thickness of the support 13 substantially does not contribute to a reduction in warpage. A height of the ridges of more than 2/3 of the thickness of the support 13 causes a decrease in the yield of semiconductor chips for electronic devices.

The grooves or the ridges provided on the back surface of the substrate may be arrayed not only in one direction, but also in a first direction and a second direction. The array of grooves or ridges forms a lattice. It is preferred that the pitch of the grooves or the ridges provided on the back surface of the substrate be equal to the chip size of the electronic device. It is furthermore preferred that the density of the grooves or the ridges be 0.1/mm to 3/mm.

It is understood from the explanations above that a low-loss high-voltage vertical power device including a nitride semiconductor can be fabricated. The support used to deposit the nitride semiconductor structure for the vertical power device may include sapphire, AlN, SiC, or the like. A layer structure of a nitride semiconductor having a dislocation density of not more than $1\times10^8$ cm$^{-2}$ may be formed on the support. The coefficient of thermal expansion of AlN and SiC is closer to that of GaN than that of sapphire. Sapphire and AlN have a larger band gap than GaN. SiC has a band gap of an indirect transition type. Accordingly, laser light passes through the support and reaches the layer structure, and thereby the layer structure can be separated from the support by laser lift-off.

The vertical diode includes a nitride semiconductor layer structure described below, which includes a contact layer connected to a cathode of the diode. The contact layer includes a nitride semiconductor layer having a high carrier concentration ($1\times10^{18}$ cm$^{-3}$). It is preferred that the contact layer have a thickness of not more than 50 μm. It is preferred that the contact layer have a dislocation density of not more than $1\times10^8$ cm$^{-2}$. In view of a reduction in production cost, fluxing is effective for forming the contact layer, the fluxing allowing films to be deposited concurrently on several tens of substrates.

The nitride semiconductor layer structure includes a drift layer of a nitride semiconductor having a low carrier concentration. The drift layer forms a junction with the contact layer. The carrier concentration of the drift layer is in a range of not less than $1\times10^{14}$ cm$^{-3}$ and not more than $2\times10^{16}$ cm$^{-3}$. It is preferred that the dislocation density of the drift layer be not more than $1\times10^8$ cm$^{-2}$.

After an electrode is formed on the nitride semiconductor layer structure, the nitride semiconductor layer structure and the electrode are bonded to a conductive substrate. The back surface of the support is irradiated with laser light for laser lift-off. The laser light is absorbed into the nitride semiconductor layer having a high carrier concentration or a sacrificed layer having a narrower band gap than GaN, and the substrate can be separated from the nitride semiconductor layer structure and the conductive substrate which are joined to each other.

Such a power electronic device is mounted on the conductive substrate, in lieu of the substrate employed for depositing the nitride semiconductor layer structure. Series resistance of a GaN substrate is thus unavoidable for the power electronic device fabricated on the GaN substrate, as disclosed in Patent Literature 2. In the power electronic device according to the embodiment, however, the series resistance of the GaN substrate is replaced with the resistance of the conductive substrate. Accordingly, the series resistance of the power electronic device can be reduced, and on-resistance can be reduced. In Patent Literature 1, a nitride semiconductor layer is formed on a sapphire substrate. The sapphire substrate, which includes an insulating body, cannot provide an electronic device having a vertical structure.

Use of a drift layer having a carrier concentration of not less than $1\times10^{14}$ cm$^{-3}$ and not more than $2\times10^{16}$ cm$^{-3}$ and a dislocation density of not more than $1\times10^8$ cm$^{-2}$ reduces leakage current and ensures high voltage resistance for a vertical electronic device effective for a high-current device.

In the case where the sacrificed layer includes a quantum well structure, a quantum well effect can be utilized to confine the light incident on the back surface of the support. This eliminates a possibility to damage a device even if a strong light source is used for separation of the substrates, and facilitates separation of the substrates.

Use of the substrate having the relaxation structure of the array of grooves and/or ridges reduces the warpage of the substrate in the relaxation structure. This enhances adhesiveness in bonding of the epitaxial substrate to the conductive substrate. Aluminum nitride and silicon carbide have a lattice constant proximate to that of a group-III nitride-based semiconductor, resulting in a reduction in the dislocation density of the group-III nitride-based semiconductor. Furthermore, aluminum nitride and silicon carbide have a coefficient of thermal expansion proximate to that of thermal expansion of the group-III nitride-based semiconductor, resulting in a reduction in the dislocation density of the group-III nitride-based semiconductor. Furthermore, aluminum nitride and silicon carbide have a higher thermal conductivity than sapphire. Heat generated during irradiation with laser light can thus be rapidly released, the heat being generated at the interface between the substrate and the nitride semiconductor. This prevents thermal deterioration of the electronic device during the separation.

Example 1

An aluminum nitride substrate is prepared. An array of grooves is provided in the back surface of the aluminum nitride substrate, the grooves having a width of 10 μm, a depth of 10 μm, and a pitch of 5,000 μm. An n$^+$-type gallium nitride layer having a carrier concentration of $1\times10^{18}$ cm$^{-3}$ is formed on the principal surface of the aluminum nitride substrate by fluxing. The gallium nitride layer has a thickness of 20 μm. Subsequently, an n$^-$-type gallium nitride layer having a carrier concentration of $7\times10^{15}$ cm$^{-3}$ is deposited by MOCVD. The gallium nitride layer has a thickness of 5 μm. After the epitaxial substrate is removed from a growth furnace, a field plate structure including silicon nitride and a Schottky electrode are formed on the surface of an epitaxial film of the epitaxial substrate. The field plate structure includes a silicon nitride film. The Schottky electrode includes Au/Ni, for example. The Schottky electrode forms a Schottky junction with the surface of the epitaxial film through an opening of the field plate structure. A molybdenum (Mo) support base is prepared. An insulating film having an opening is formed on the principal surface of the Mo support base. A silicon oxide film is used, for example, as the insulating film. The opening of the insulating film is processed according to the size of the Schottky electrode. The opening is formed by reactive ion etching (RIE). A conductive adhesive agent is applied to the opening to form an adhesive layer. The conductive adhesive agent is applied so as to form an Au/Sn adhesive layer, for instance. The Schottky electrode on the epitaxial film and the Mo support base are pressure-bonded to form a junction, and the Mo support base and the epitaxial substrate are bonded. The back surface of the epitaxial film is irradiated with KrF excimer laser light in the bonded state to melt the interface between the substrate and the nitride semiconductor layer. The aluminum nitride substrate is then separated. The aluminum nitride substrate can be polished for reuse. An ohmic electrode is formed on an exposed surface of the separated nitride semiconductor layer. The ohmic electrode includes Ti/Au, for example. The Mo support base and the nitride semiconductor layer are diced into semiconductor chips. Each semiconductor chip includes a Schottky barrier diode.

Example 2

A sapphire substrate is prepared. An array of grooves is provided in the back surface of the sapphire substrate, the grooves having a width of 20 μm, a depth of 50 μm, and a pitch of 1,000 μm. An InGaN layer having a high proportion of indium (0.07) is formed as a buffer layer on the sapphire substrate by MOCVD. Subsequently, an n$^+$-type gallium nitride layer having a carrier concentration of $1\times10^{18}$ cm$^{-3}$ and a thickness of 10 μm, an n$^-$-type gallium nitride layer having a carrier concentration of $7\times10^{15}$ cm$^{-3}$ and a thickness of 5 μm, and a p-type gallium nitride layer having a carrier concentration of $1\times10^{17}$ cm$^{-3}$ and a thickness of 2 μm are formed to provide an epitaxial substrate including a layer structure. The epitaxial substrate and a Mo support base are joined, and then the back surface of the sapphire substrate is irradiated with YAG laser light. The YAG laser light, which is absorbed at a high absorption rate in the InGaN buffer layer having a high proportion of indium, readily melts the InGaN buffer layer. The layer structure is then separated from the sapphire substrate. An electrode is formed in a similar manner to Example 1. Thereby, a p-n junction diode is prepared. The separated sapphire substrate is reusable.

Example 3

In Example 1, a sapphire substrate is prepared having a back surface in which grooves are provided in a lattice shape at a pitch corresponding to a device size. In Example 3, the pitch of the grooves is 1.5 mm. A semiconductor region of a gallium nitride-based semiconductor is deposited on the principal surface of the sapphire substrate as in Example 1. Since the substrate is grooved, the sapphire substrate and an epitaxial film are strained and warped after crystal growth, due to a difference in coefficient of thermal expansion between the sapphire substrate and the epitaxial film. The strain is relieved by the array of grooves in the back surface of the sapphire substrate, and thus adhesiveness in bonding of the substrate to a conductive support base is improved. Accordingly, diodes are produced at an excellent yield.

Example 4

A silicon carbide substrate is prepared. An n$^+$-type gallium nitride layer having a thickness of 40 μm is formed on the silicon carbide substrate by hydride VPE (HYPE). The n$^+$-type gallium nitride layer has a carrier concentration of $1\times10^{18}$ cm$^{-3}$. An n$^-$-type gallium nitride layer having a thickness of 5 μm is formed on the n$^+$-type gallium nitride layer by MOCVD. Furthermore, a p-type gallium nitride layer having a thickness of 3 μm is deposited on the type gallium nitride layer. After the epitaxial substrate is removed from a growth furnace, a field plate structure including silicon nitride and an ohmic electrode are formed on the surface of an epitaxial film of the epitaxial substrate. The field plate structure includes a silicon nitride film. The ohmic electrode includes Ti/Au, for example. A Mo support base is prepared as in Example 1. An insulating film having an opening is formed on the principal surface of the Mo support base. A silicon oxide film is used, for example, as the insulating film. The opening of the insulating film is processed according to the size of the ohmic electrode. The opening is formed by RIE. A conductive adhesive agent is applied to the opening to form an adhesive layer. The conductive adhesive agent is applied so as to form an Au/Sn adhesive layer, for instance. The ohmic electrode on the epitaxial film and the Mo support base are pressure-bonded to form a junction, and the Mo support base and the epitaxial substrate are bonded. The back surface of the epitaxial film is irradiated with KrF excimer laser light in the bonded state to melt the interface between the substrate and a nitride semiconductor layer. The silicon carbide substrate is then separated. The silicon carbide substrate can be polished for reuse. An ohmic electrode is formed on an exposed surface of the separated nitride semiconductor layer. The ohmic electrode includes Ti/Au, for example. The Mo support base and the nitride semiconductor layer are diced into semiconductor chips. Each semiconductor chip includes a p-n junction diode.

As described above, a method of fabricating a gallium nitride-based semiconductor electronic device is provided, the method being capable of preventing a reduction in adhesiveness between the gallium nitride-based semiconductor layer and the conductive substrate.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a gallium nitride-based semiconductor electronic device, the method comprising the steps of:
    preparing a substrate having a first surface and a second surface, the first surface being configured to deposit a gallium nitride-based semiconductor, the second surface being provided on the side opposite to the first surface;
    depositing a semiconductor region on the first surface of the substrate into an epitaxial substrate, the semiconductor region comprising at least one gallium nitride-based semiconductor layer;
    preparing a conductive substrate;
    bonding the conductive substrate to the epitaxial substrate into a first substrate product such that the semiconductor region is provided between the first surface of the substrate and the conductive substrate; and
    separating the semiconductor region and the substrate from each other by laser lift-off involving irradiation of the second surface of the substrate with laser light, subsequent to the bonding of the conductive substrate to the epitaxial substrate, to fabricate a second substrate product comprising the conductive substrate and the semiconductor region, wherein
    the semiconductor region of the second substrate product has an exposed surface;
    the substrate comprises a support comprising a material different from the gallium nitride-based semiconductor;
    the support is exposed on the second surface of the substrate; and
    at least one of a plurality of grooves and a plurality of ridges is arrayed on the second surface of the substrate.

2. The method according to claim 1 further comprising the step of separating the semiconductor region and the substrate from each other, and then forming a first electrode on the exposed surface of the second substrate product, wherein
the semiconductor region includes a contact layer of gallium nitride-based semiconductor doped with an n-type dopant; and
the contact layer is exposed on the exposed surface of the semiconductor region.

3. The method according to claim 2, wherein
the semiconductor region includes a drift layer of gallium nitride-based semiconductor;
the contact layer is provided between the drift layer and the support;
the contact layer has a higher carrier concentration than the drift layer; and
the drift layer has a carrier concentration of not more than $2\times10^{16}$ cm$^{-3}$.

4. The method according to claim 3, wherein
the drift layer has a thickness of not less than 3 μm.

5. The method according to claim 3, wherein
the contact layer includes gallium nitride; and
the drift layer includes gallium nitride.

6. The method according to claim 1, wherein
the exposed surface is a polished surface.

7. The method according to claim 1, wherein
the grooves have a depth of not less than 5 μm and not more than 300 μm.

8. The method according to claim 1, wherein
the grooves have a depth of not less than 1/10 of the thickness of the support and not more than 2/3 of the thickness of the support.

9. The method according to claim 1, wherein
the ridges have a height of not less than 5 μm and not more than 300 μm.

10. The method according to claim 1, wherein
the ridges have a height of not less than 1/10 of the thickness of the support and not more than 2/3 of the thickness of the support.

11. The method according to claim 1, wherein
the support includes one of sapphire, silicon carbide, and aluminum nitride.

12. The method according to claim 1 further comprising the step of forming an insulating film on a principal surface of the semiconductor region of the epitaxial substrate, and then forming an electrode structure, prior to fabrication of the first substrate product, wherein
the electrode structure includes a field plate electrode and a second electrode, the field plate electrode being provided on the insulating film, the second electrode being in contact with the principal surface of the semiconductor region through an opening of the insulating film; and
the second electrode and the field plate electrode are electrically connected to the conductive substrate.

13. The method according to claim 12, wherein
the second electrode includes a Schottky electrode.

14. The method according to claim 1, wherein
the gallium nitride-based semiconductor electronic device includes a Schottky barrier diode.

15. The method according to claim 12, wherein
the second electrode includes an ohmic electrode;
the semiconductor region includes a p-type gallium nitride-based semiconductor layer and an n-type gallium nitride-based semiconductor layer;
the p-type gallium nitride-based semiconductor layer and the n-type gallium nitride-based semiconductor layer form a p-n junction; and
the second electrode forms a junction with the p-type gallium nitride-based semiconductor layer.

16. The method according to claim 1, wherein
the gallium nitride-based semiconductor electronic device includes a p-n junction diode.

17. The method according to claim 1, wherein
the semiconductor region is provided with a sacrificed layer including a semiconductor layer having a smaller band gap than that of the support;
the band gap of the sacrificed layer in the semiconductor layer is smaller than energy corresponding to a wavelength of the laser light;
the sacrificed layer has the smallest band gap in the semiconductor region; and
the sacrificed layer is melted by irradiation with the laser light.

18. The method according to claim 1, wherein
the epitaxial substrate is bonded to the conductive substrate using a conductive adhesive agent.

19. The method according to claim 1, wherein
the bonding of the epitaxial substrate to the conductive substrate is performed by pressure-bonding.

20. The method according to claim 1, wherein
the conductive substrate includes molybdenum, tungsten, or an alloy thereof.

* * * * *